(12) United States Patent
Tien-Tung et al.

(10) Patent No.: US 7,565,741 B2
(45) Date of Patent: Jul. 28, 2009

(54) METHODS FOR DESIGNING LOBE-TYPE ROTORS

(75) Inventors: Chung Tien-Tung, Taipei Hsien (TW); Lin Heng-I, Taipei Hsien (TW)

(73) Assignee: Liung Feng Industrial Co., Ltd., Taipei Hsien (TW)

( * ) Notice: Subject to any disclaimer, the term of this patent is extended or adjusted under 35 U.S.C. 154(b) by 746 days.

(21) Appl. No.: 11/338,664

(22) Filed: Jan. 25, 2006

(65) Prior Publication Data

US 2007/0050066 A1    Mar. 1, 2007

Related U.S. Application Data

(63) Continuation-in-part of application No. 11/214,876, filed on Aug. 31, 2005, now Pat. No. 7,255,545.

(51) Int. Cl.
| | |
|---|---|
| B21D 53/78 | (2006.01) |
| F02B 53/04 | (2006.01) |
| F01C 1/16 | (2006.01) |
| F01C 1/18 | (2006.01) |
| F01C 21/10 | (2006.01) |
| G06F 17/50 | (2006.01) |
| G06F 7/60 | (2006.01) |

(52) U.S. Cl. .................. 29/889; 123/218; 418/150; 418/201.3; 418/206.5; 703/1; 703/2

(58) Field of Classification Search .................. 29/889; 123/200, 218; 418/61.2, 150, 201.3, 206.5; 703/1, 2

See application file for complete search history.

(56) References Cited

U.S. PATENT DOCUMENTS 6,776,594 B1 *    8/2004   Heng-I et al. ............ 418/206.5

* cited by examiner

*Primary Examiner*—David P Bryant
*Assistant Examiner*—Alexander P Taousakis
(74) *Attorney, Agent, or Firm*—Rosenberg, Klein & Lee (57) ABSTRACT

The present invention provides a method for designing lobe-type rotors which enables a defined rotor and a conjugate rotor having three or more than three lobes intermeshing and conjugating to each other and by setting suitable parameters to generate curve portions of a single lobe of the defined rotor as a pattern including a curve E, an arc A, an arc B, an arc F, and a straight line Y; the main feature of the present invention is that a radius $r_B$ of the arc B is defined by following equation:

$$r_B + (R - r_B)\sin\alpha = \frac{D}{2}$$

$$r_B = \frac{D/2 - R\sin\alpha}{1 - \sin\alpha}$$

moreover, the straight line Y is the external common tangent line of the arc B and the arc F, and respectively getting two tangent points therefrom to be defined as two end points of the straight line Y.

2 Claims, 7 Drawing Sheets

METHODS FOR DESIGNING LOBE-TYPE ROTORS

1. REFERENCE TO RELATED APPLICATIONS

This application is a continuation-in-part application of U.S. patent application Ser. No. 11/214,876 filed Aug. 31, 2005 now U.S. Pat. No. 7,255,545, the entire contents of the above mentioned application being incorporated herein by reference.

BACKGROUND OF THE INVENTION

2. Field of the Invention

The present invention relates to methods for designing lobe-type rotor. By setting suitable parameters, the method can profile a defined rotor and a conjugate rotor with three or more than three lobes which intermesh and conjugate to each other, and effectively evaluate optimum performance in intermeshing and conjugating, whereby to provide higher compression ratio and larger discharge capacity, secure a smooth process while working chamber undergoing compression and expansion, and reduce leakage, thus can lessen noise and vibration while operation of the rotors.

3. Related Art

A large variety of related lobe-type rotor mechanism are already known which generally includes a defined rotor and a conjugate rotor with a single-lobe type, double-lobe type or three-lobe type, and the defined rotor and the conjugate rotor intermesh and conjugate to each other. U.S. Pat. Nos. 1,426,820, 4,138,848, 4,224,016, 4,324,538, 4,406,601, 4,430,050 and 5,149,256 disclose relevant rotors. The rotors of the prior arts have drawbacks that curves of each lobe of the rotors are not continuously and smoothly connected between each segment; such drawbacks cause tips of the rotors do not mesh completely with other rotor when they are rotating. Consequently, in applying to machines working as periodical expansion and compression operation, the abnormal situations such as noise and vibration take place in working chamber enclosed by a defined rotor, conjugate rotor and inner walls of cylinder. Moreover, inappropriate intermeshing between the rotors increases wear and therefore reduces the durability of operation.

In view of aforesaid disadvantages, U.S. patent application Ser. No. 11/214,876 has disclosed a defined rotor and a conjugate rotor designed by variety of parameters. Such rotors can reduce noise and vibration as operation.

SUMMARY OF THE INVENTION

Accordingly, an object of the present invention is to provide a method for designing lobe-type rotors which is able to generate a defined rotor and a conjugate rotor both with three or more than three lobes intermeshing and conjugating to each other by different parameters. The rotors generated by way of the method can provide higher compression ratio and larger discharge capacity as apply to machines for periodical expansion and compression operation, secure a smooth process while working chamber undergoing compression and expansion, and which reduce leakage as well reduce noise and vibration.

To achieve the above-mentioned objects, the method for designing a defined rotor and a conjugate rotor with three or more than three lobes of the present invention includes: curve portions of a single lobe of the defined rotor as a pattern including a curve E, an arc A, an arc B, an arc F, and a straight line Y, then imaging N−1 copy (Hereinafter referred to as N−1 copy in which N represents the number of lobes and is bigger than or equal to three) and respectively rotating each curve portion in sequence at an appropriate degree which is computed by 360/N to terminal degree which is computed by (N−1)*360/N whereby to integrately form the defined rotor with three or more than three lobes. By way of the curve portions of the defined rotor to generate conjugate curve portions for forming the conjugate rotor; the main feature of the present invention is that a radius $r_B$ of the arc B is defined by following equation:

$$r_B + (R - r_B)\sin\alpha = \frac{D}{2}$$

$$r_B = \frac{D/2 - R\sin\alpha}{1 - \sin\alpha}$$

(in which R is the maximum radius of the defined rotor, and D is a width of the defined rotor)

Another feature of the present invention is that an end point of the arc F is located in a direction of a degree of $\Delta\theta$ which is an angle value and computed by 360° divided by N (N is the number of lobes), and a straight line Y which is the external common tangent line of the arc B and the arc F and respectively getting two tangent points P3 and P4 therefrom to be two end points of the straight line Y wherein the point P3 designated as an end point of the arc B and the point P4 designated as a start point of the arc F.

DESCRIPTION OF THE PREFERRED EMBODIMENTS

Figure 1:
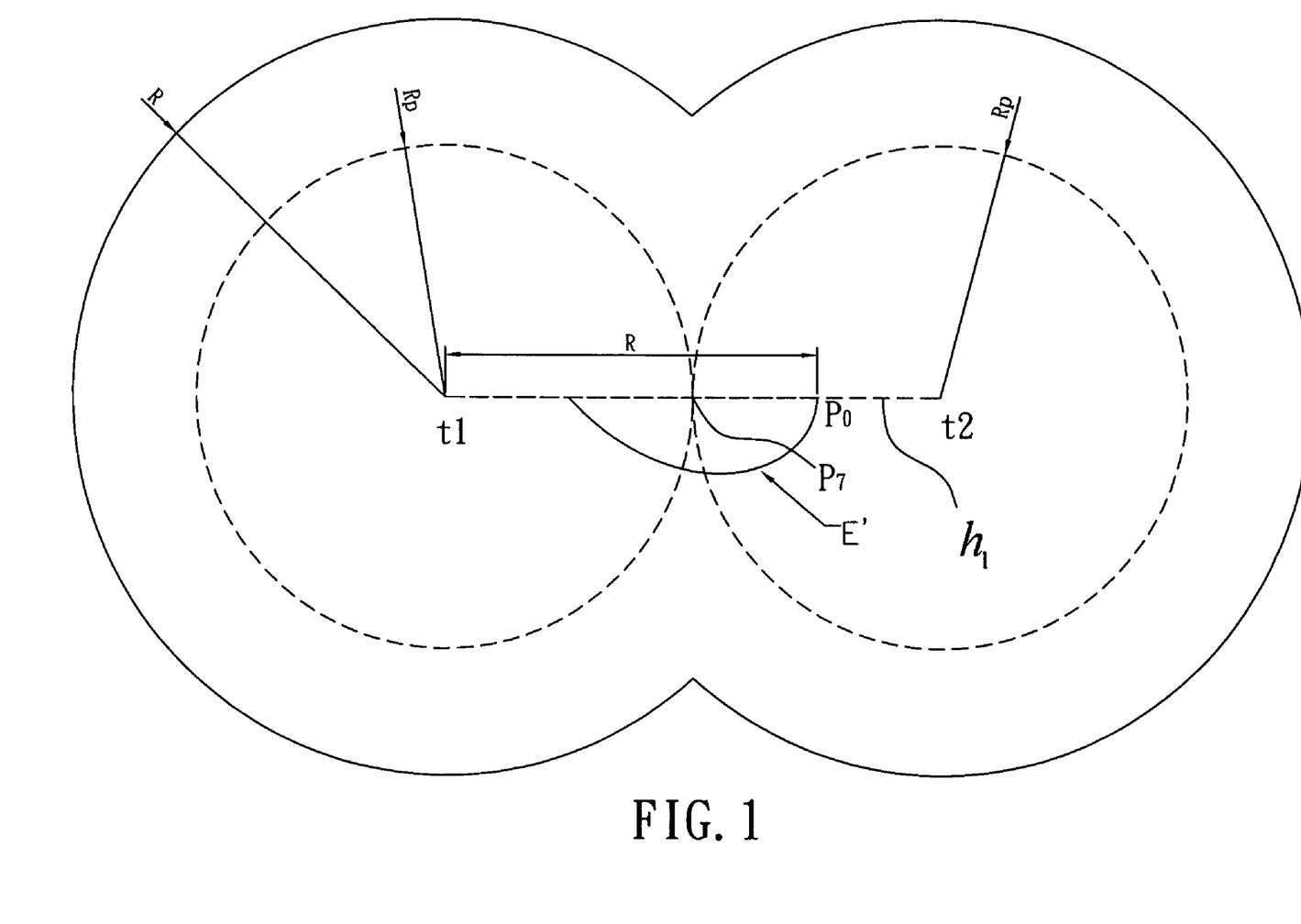
FIG. 1 is a schematic view of forming a tip conjugate curve by a method for designing lobe-type rotors of the present invention.
Figure 2:
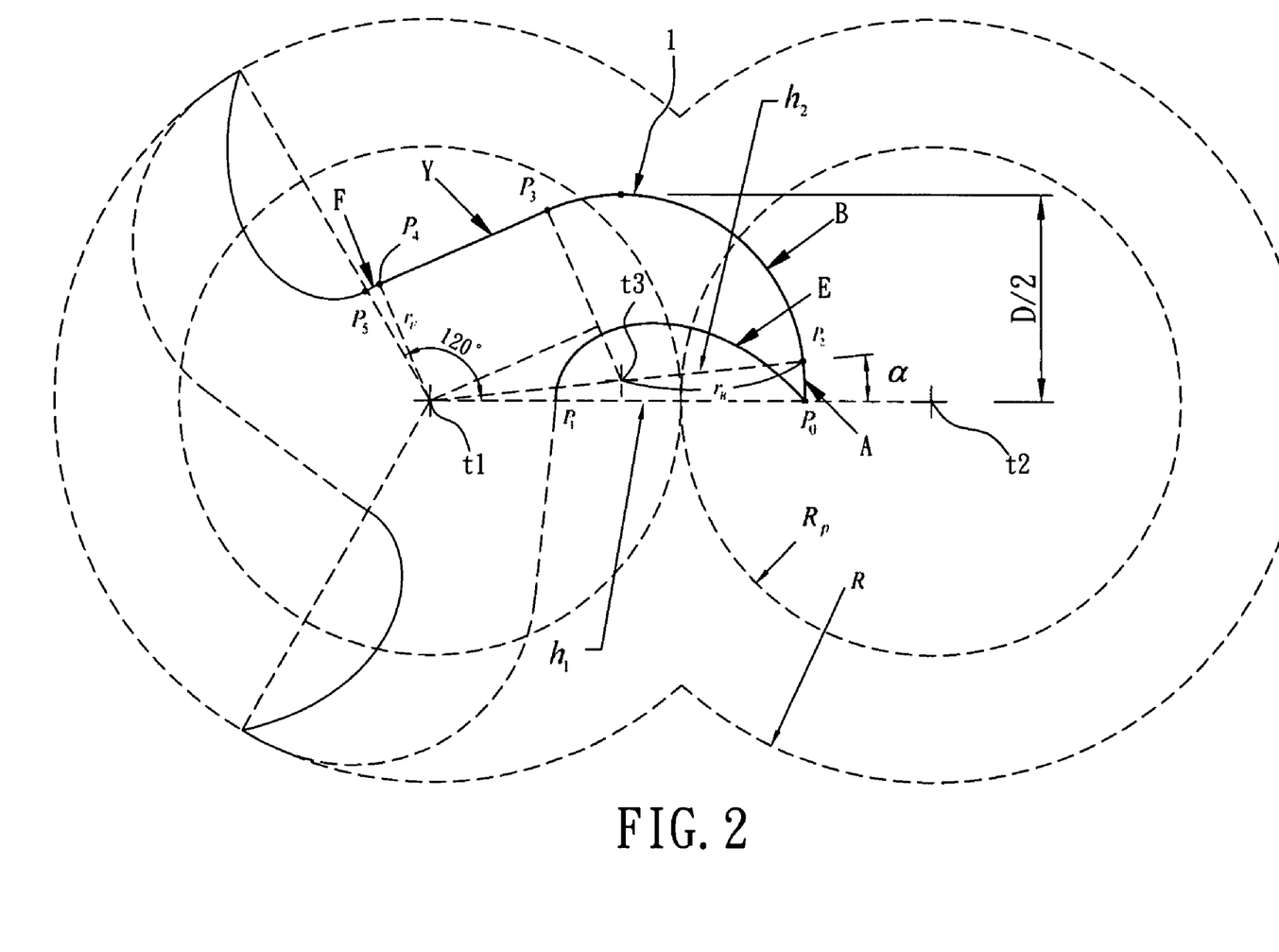
FIG. 2 is a schematic view of forming a three-lobe profile of a defined rotor by the method of the present invention.
Figure 3:
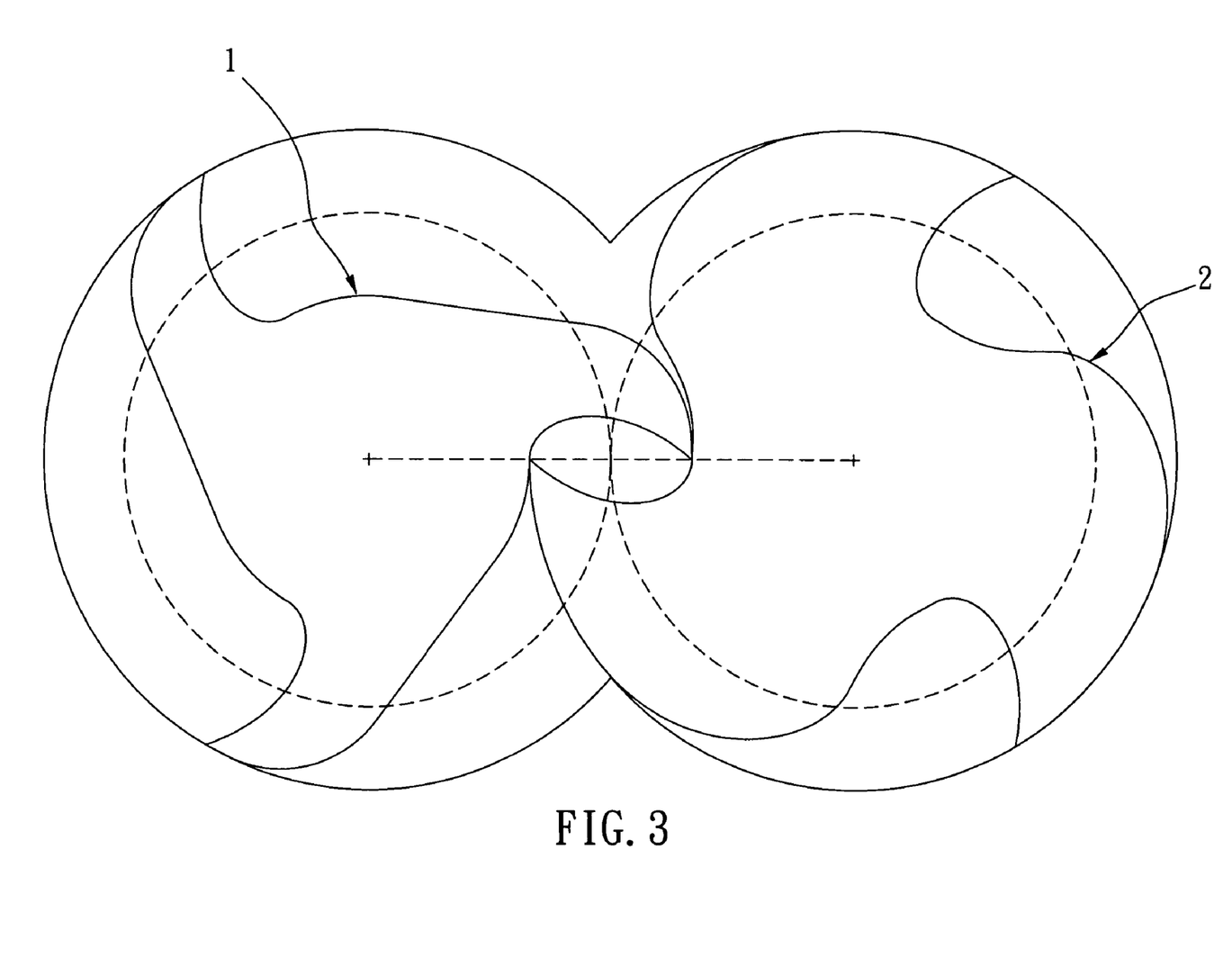
FIG. 3 is a schematic view of forming a three-lobe profile of a conjugate rotor by the method of the present invention.

A three-lobe rotor design process in accordance with the present invention is adapted for designing curve portions of a defined rotor 1 by suitable parameters, and then get the curve portions of a conjugate rotor 2 with conjugate theory. Referring to FIGS. 1 to 3, designing process for forming the curve portions of the defined rotor 1 comprises the following steps:

1. Designate a maximum radius R and a width D of the defined rotor 1, a pitch circle radius Rp of the defined and the conjugate rotor 1, 2, a first center t1 of the defined rotor 1 and a second center t2 of the conjugate rotor 2, wherein R=60 mm, D=65 mm, Rp=40 mm, the pitch circle radius Rp is smaller than radius R, and R and Rp are in appropriate ratio R=3Rp/2.

2. Referring to FIG. 1, define a reference horizontal line h1 by straight connecting the first center t1 and the second center t2, a base point P0 located on the reference horizontal line h1 and being offset from the first center t1 with a length same as the radius R, a conjugate curve E′ generated as the base point P0 rotating around the first center t1, a curve E generated by symmetrically imaging the conjugate curve E' against a tangent point P7 of the two pitch circles of the defined and the conjugate rotor, and a first point P1 located in an intersection of the curve E and the horizontal line h1.

3. Referring to FIG. 2, designate a second point P2 which is formed by drawing around the first center t1 with the radius R from the point P0 in a central angle α (α is 6°), whereby an arc A is generated between the point P0 and P2, and is smoothly connected to the curve E.

4. Define a second line h2 by straight connecting the first center t1 and the second point P2 and further designating a third center t3 thereon, of which a radius is $r_B$.

5. The radius $r_B$ is defined by following equation:

$$r_B + (R - r_B)\sin\alpha = \frac{D}{2}$$

$$r_B = \frac{D/2 - R\sin\alpha}{1 - \sin\alpha}$$

(wherein R is the maximum radius of the defined rotor 1, that is, a length between the first center t1 and the second point P2)

6. defining an arc B by drawing around the third center t3 with the radius $r_B$ from the second point P2 to a third point P3, wherein the third point P3 being located above the third center t3;

7. defining an arc F by drawing around the first center t1 with a radius $r_F$ from a fourth point P4 to a fifth point P5 wherein the fifth point P5 is located in a direction of a degree of Δθ (Δθ is 120° which is computed by 360° divided by 3, 3 is the number of lobes), and the radius $r_F$ is defined by following equation $r_F = 2Rp - R$;

8. defining a straight line Y which is the external common tangent line of the arc B and the arc F and respectively taking two tangent points P3 and P4 therefrom to be defined as two end points of the straight line Y wherein the point P3 designated as an end point of the arc B and the point P4 designated as a start point of the arc F;

whereby the curve portion of a single lobe of the defined rotor 1 is generated by linking the curve E, the arc A, the arc B, the arc F, and the straight line Y; further imaging two copies of the curve portion and respectively rotating the copied curve portion at 120° (which is computed by 360/3, 3 is the number of lobes) and 240° (which is computed by (3−1)*360/3, 3 is the number of lobes) in sequence to integrately form the defined rotor 1 with three lobes.

Moreover, the conjugate rotor 2 is formed by the above-described steps through conjugate curve portions profiled respectively from each arc and curve of the three-lobe of the defined rotor 1.

Figure 4:
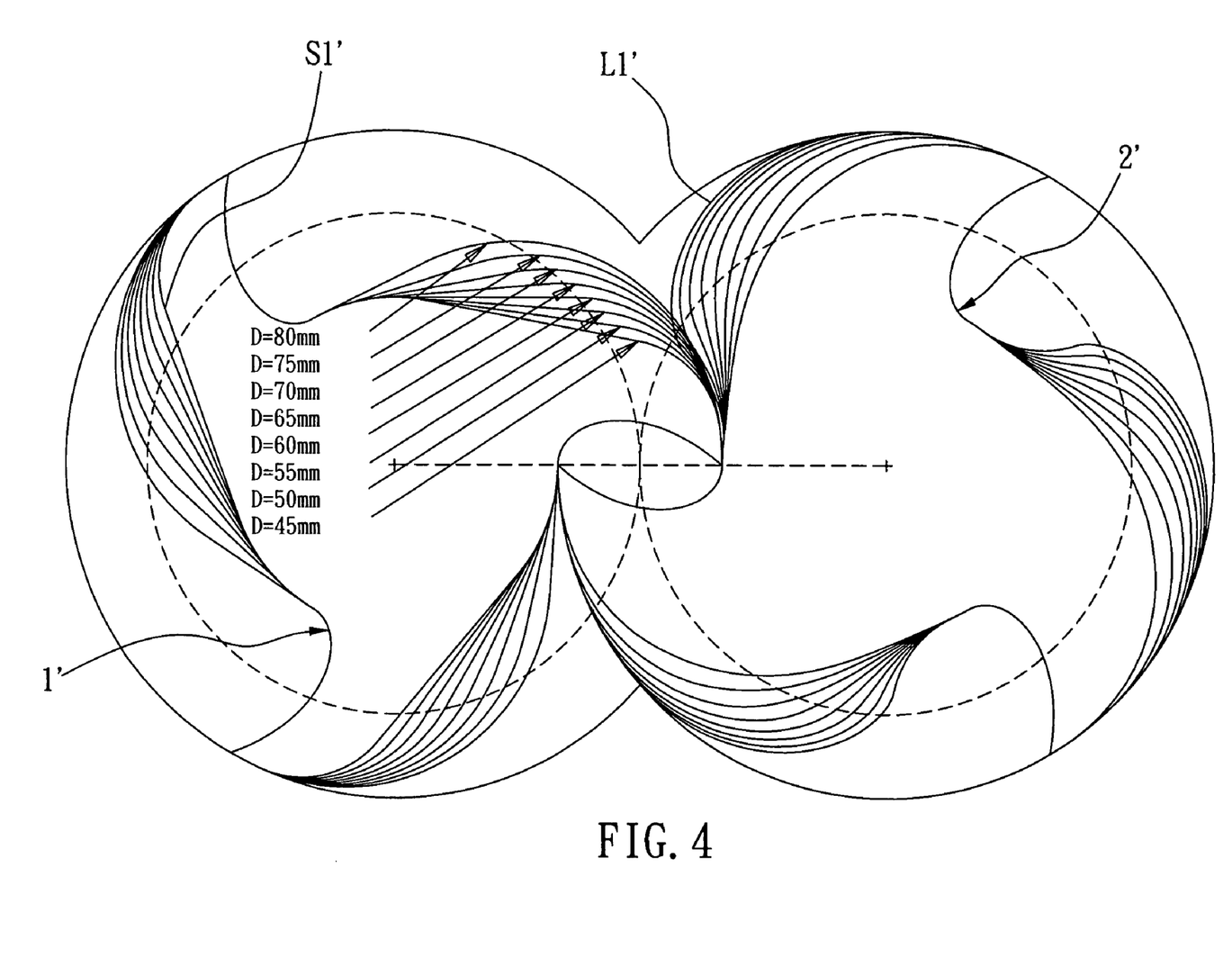
FIG. 4 is a schematic view of various combinations of the three-lobe defined rotor and conjugate rotor, wherein a width D thereof is 45, 50, 55, ... 80 mm and a central angle α is 6°.

Further referring to FIG. 4, which is a schematic view of various combinations of the three-lobe defined rotor and conjugate rotor, wherein the width D thereof is 45, 50, 55, 60 . . . 80 mm and the central angle α is 6°; as general characteristics of conjugate intermeshing between two rotors, the defined rotor 1 (S1) of the minimum the width D corresponds to the conjugate rotor 2 (L1) of the maximum value. Accordingly, depending on practical applications, an appropriate size of the defined rotor 1 and the conjugate rotor 2 can be determined by analogy with aforesaid characteristics.

Figure 5:
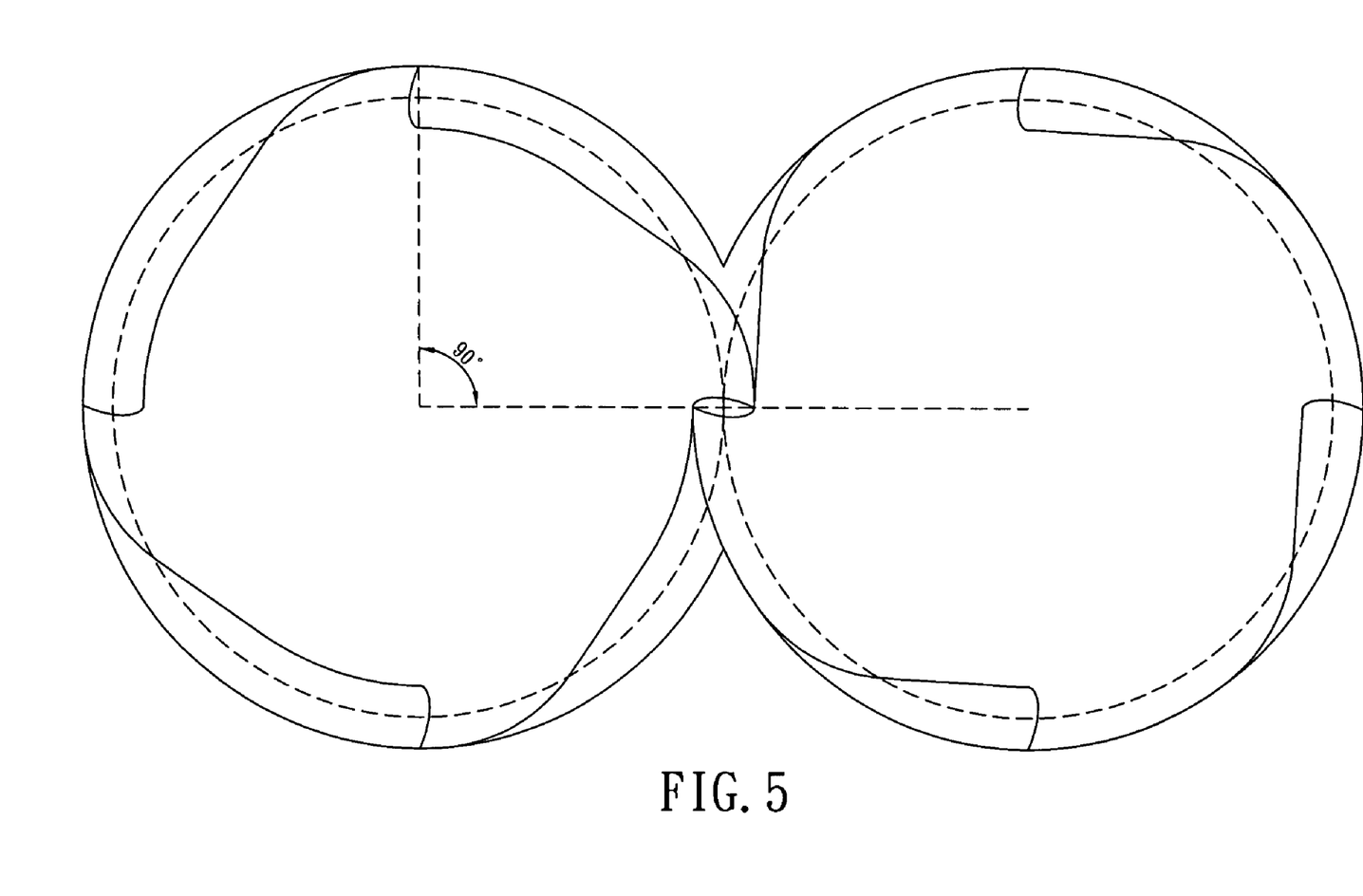
FIGS. 5 to 7 are embodiments of four lobes, five lobes, and ten lobes of the defined rotor and conjugate rotor of the present invention.
Figure 6:
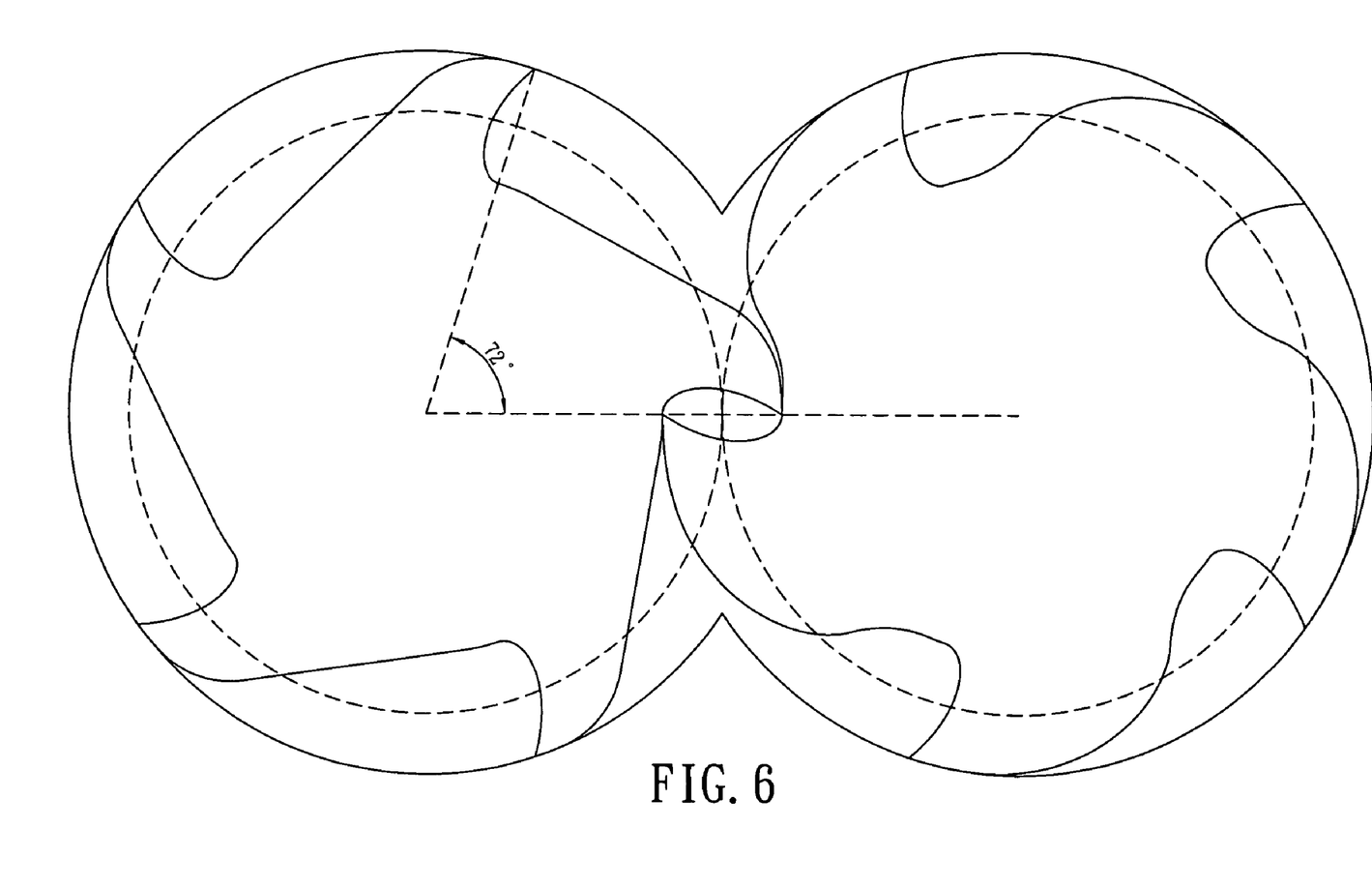
Figure 7:
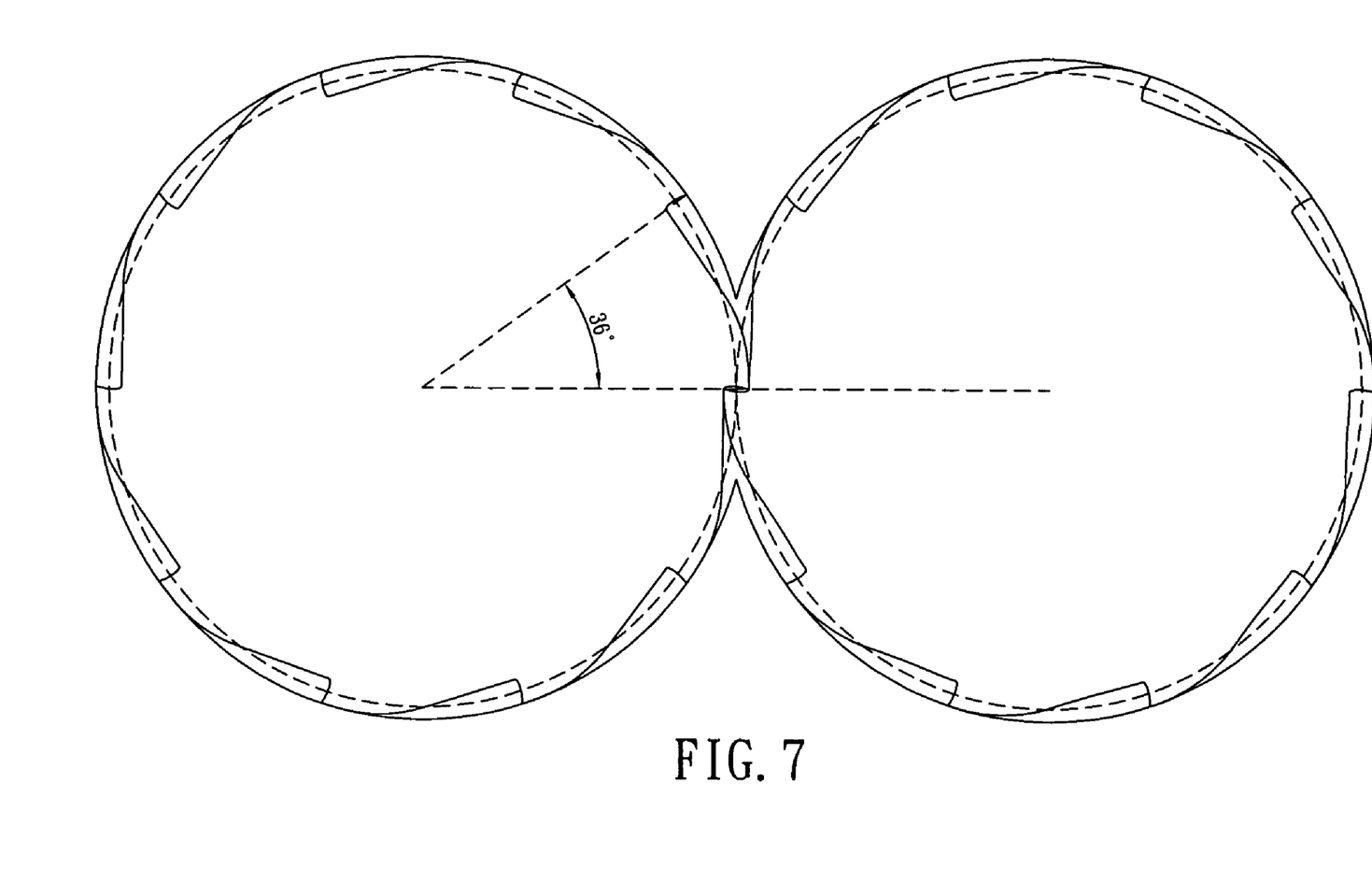

Further referring to FIGS. 5 to 7, which are embodiments of four lobes, five lobes, and ten lobes of the defined rotor and conjugate rotor; designing process are same as aforesaid steps, however, the degree of Δθ is different than it used in the three-lobe rotor; The Δθ is an angle value and which is computed by 360°/N (N, the number of lobes), the Δθ shown in FIG. 5 is 90° (computed by 360°/4) as applied to four lobes rotor, the Δθ shown in FIG. 6 is 72° (computed by 360°/5) for five lobes rotor, and the Δθ shown in FIG. 7 is 36° (computed 360°/10) for ten lobes rotor.

By setting suitable parameters, the method can profile three lobes or more than three lobes of the defined rotor 1 and the conjugate rotor 2 which intermesh and conjugate to each other, and effectively evaluate optimum performance in intermeshing and conjugating, whereby to provide higher compression ratio and larger discharge capacity, secure a smooth process while working chamber undergoing compression and expansion, and reduce leakage. Besides, the conjugate curve portion of the conjugate rotor 2 relatively profiled through the arc F of the defined rotor 1 are still arc, could effectively enhance the sealing ability further.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A method for designing lobe-type rotors adapted for generating a defined rotor and a conjugate rotor both having three or more than three lobes intermeshing and conjugating to each other by setting suitable parameters, including: curve portions of a single lobe of the defined rotor as a pattern generated by a curve E, an arc A, an arc B, an arc F, a straight line Y, then imaging (N−1) copy of the curve portion in which N represents the number of lobes and is bigger than or equal to three, and then respectively rotating each copy curve portion in sequence at an appropriate degree computed by 360/N to terminal degree which is computed by (N−1)*360/N, whereby to integrately form the defined rotor with three or more than three lobes; furthermore, by way of the curve portions of the defined rotor to generate conjugate curve portions for forming the conjugate rotor, wherein the method for designing a single lobe curve portion of the defined rotor comprising:

designating a maximum radius R of the defined rotor and a width D of the defined rotor, a pitch circle radius Rp of the defined rotor and the conjugate rotor, a first center t1 of the defined rotor and a second center t2 of the conjugate rotor, wherein a distance between the first center t1 and the second center t2 is 2Rp, the pitch circle radius Rp is smaller than radius R, and R and Rp are in appropriate ratio in length;

defining a reference horizontal line h1 by straight connecting the first center t1 and the second center t2, a base point P0 located on the reference horizontal line h1 and being offset from the first center t1 with a length same as the radius R, a conjugate curve E' generated as the base point P0 rotating around the first center t1, a curve E generated by relatively imaging the conjugate curve E' against a tangent point P7 of the two pitch circles of the defined rotor and the conjugate rotor, therefore a first point P1 located in an intersection of the curve E and the horizontal line h1;

designating a second point P2 formed by drawing around the first center t1 with the radius R from the point P0 at an central angle α, thereby an arc A generated by connecting the point P0 and P2, and smoothly connected to the curve E;

defining a second line h2 by straight connecting the first center t1 and the second point P2, and further designating a third center t3 thereon and a radius $r_B$ wherein the radius $r_B$ is defined by following equation:

$$r_B + (R - r_B)\sin\alpha = \frac{D}{2}$$

$$r_B = \frac{D/2 - R\sin\alpha}{1 - \sin\alpha}$$

defining an arc B by drawing around the third center t3 with the radius $r_B$ from the second point P2 to a third point P3, wherein the third point P3 is located above the third center t3;

defining an arc F by drawing around the first center t1 with a radius $r_F$ from a fourth point P4 to a fifth point P5 wherein the fifth point P5 is located in a direction of a degree of $\Delta\theta$ which is computed by 360°/N, and the radius $r_F$ is defined by following equation $r_F=2Rp-R$;

defining a straight line Y which is the external common tangent line of the arc B and the arc F, and respectively taking two tangent points P3 and P4 therefrom to be defined as two end points of the straight line Y, wherein the point P3 is designated as an end point of the arc B and the point P4 is designated as a start point of the arc F;

generating the curve portion of the single lobe of the defined rotor by linking the curve E, the arc A, the arc B, the arc F, and the straight line Y.

2. The method for designing lobe-type rotors as claimed in claim 1, wherein the maximum radius R of the defined rotor and the pitch circle radius Rp are in a ratio R=3Rp/2.

* * * * *